United States Patent [19]

Donelon et al.

[11] Patent Number: 5,171,709
[45] Date of Patent: Dec. 15, 1992

[54] LASER METHODS FOR CIRCUIT REPAIR ON INTEGRATED CIRCUITS AND SUBSTRATES

[75] Inventors: John J. Donelon, Mahopac; James P. Doyle, Bronx, both of N.Y.; Jerry E. Hurst, Jr., San Jose, Calif.; Stephen M. Rossnagel, White Plains, N.Y.

[73] Assignee: International Business Machines Corporation, Armonk, N.Y.

[21] Appl. No.: 770,838

[22] Filed: Oct. 4, 1991

Related U.S. Application Data

[63] Continuation-in-part of Ser. No. 233,487, Jul. 25, 1988.

[51] Int. Cl.$^5$ .................. H01L 21/26; H01L 21/465; C01B 31/00
[52] U.S. Cl. .................. 437/173; 437/228; 437/245; 437/248; 437/935; 204/157.47
[58] Field of Search ............ 219/121.69, 121.85; 427/53.1; 204/157.47; 437/248, 249, 246, 195, 228, 173, 174, 19, 935

[56] References Cited

U.S. PATENT DOCUMENTS

| | | | |
|---|---|---|---|
| 3,740,523 | 6/1973 | Cohen | 219/121.69 |
| 4,179,310 | 12/1979 | Compton | 219/121.69 |
| 4,217,183 | 8/1980 | Melcher | 204/15 |
| 4,239,789 | 12/1980 | Blum et al. | 427/53.1 |
| 4,259,367 | 3/1981 | Dougherty | 219/121.69 |
| 4,286,250 | 8/1981 | Saccheti | 148/DIG. 93 |
| 4,348,263 | 9/1982 | Draper et al. | 204/29 |
| 4,349,583 | 9/1982 | Kulynych et al. | 427/53.1 |
| 4,359,485 | 11/1982 | Donnelly et al. | 427/53.1 |
| 4,457,972 | 7/1984 | Griffith | 428/334 |
| 4,511,445 | 4/1985 | Forrest | 204/157.47 |
| 4,555,303 | 11/1989 | Legge | 437/946 |
| 4,574,095 | 3/1986 | Baum et al. | 427/53.1 |
| 4,578,155 | 3/1986 | Halliwell et al. | 204/15 |
| 4,578,157 | 3/1986 | Halliwell et al. | 204/15 |
| 4,585,517 | 4/1986 | Stemple | 437/946 |
| 4,615,904 | 10/1986 | Ehrlich et al. | 427/53.1 |
| 4,615,907 | 10/1986 | Boeke et al. | 427/53.1 |
| 4,624,736 | 11/1986 | Gee et al. | 219/211.85 |
| 4,630,355 | 12/1986 | Johnson | 437/19 |
| 4,659,587 | 4/1987 | Imura | 427/35 |
| 4,663,826 | 5/1987 | Baeuerle | 29/571 |
| 4,667,058 | 5/1987 | Catulano | 219/121.69 |
| 4,681,774 | 7/1987 | Halliwell | 427/53.1 |
| 4,691,091 | 9/1987 | Lyons et al. | 219/121 LM |
| 4,704,342 | 11/1987 | Lehrer et al. | 427/53.1 |
| 4,795,720 | 1/1989 | Kawanabe | 437/922 |
| 4,865,873 | 9/1989 | Cole | 427/53.1 |
| 4,877,644 | 10/1989 | Wu et al. | 427/53.1 |
| 4,900,695 | 2/1990 | Takahashi et al. | 437/192 |

FOREIGN PATENT DOCUMENTS

| | | |
|---|---|---|
| 18846 | 11/1980 | European Pat. Off. . |
| 86520 | 8/1983 | European Pat. Off. . |
| 230128 | 7/1987 | European Pat. Off. . |
| 3139168 | 10/1980 | Fed. Rep. of Germany . |
| 227738 | 10/1984 | German Democratic Rep. . |
| 161232 | 7/1985 | German Democratic Rep. ............ 437/928 |
| 96097 | 10/1984 | Japan . |
| 104083 | 10/1984 | Japan . |

OTHER PUBLICATIONS

R. H. Banks, L. D. Cook, S. B. Rosenbaum, C. Worms, "Laser Generated Conductive Lines", IBM Technical (List continued on next page.)

Primary Examiner—Brian E. Hearn
Assistant Examiner—Linda J. Fleck
Attorney, Agent, or Firm—Louis J. Percello

[57] ABSTRACT

The present invention relates to a method of accessing and repairing electrical opens in conducting metal lines on a semiconductor chip or other substrate using a thin conductive layer formed within the surface of a substrate and laser plating techniques. What has been described is a maskless means of repairing discontinuities in a conductor disposed on the surface of a substrate wherein the surface is locally irradiated to form a reversible carbonaceous layer thereon. This reversible carbonaceous layer acts as a base for electrodeless deposition of a metal to form a bridge across the discontinuity by laser-enhanced exchange plating or other suitable methods. Further, a means of accessing and repairing a discontinuity buried by a cover layer of an insulating or passivating material is described, wherein access to the discontinuity is provided by ablating away the cover layer using a pulsed excimer laser at a first power level.

13 Claims, 3 Drawing Sheets

OTHER PUBLICATIONS

Disclosure Bulletin, vol. 19, No. 3, Aug. 1976, p. 1014.
von Gutfeld et al., "Laser Enhanced Plating and Etching: Mechanisms and Applications," IBM J. Res. Develop., vol. 26, No. 2, pp. 136–144, (Mar. 1982).
Edge Profile Control in Laser Ablation of Polymers: Proximity Etching, J. T. C. Yeh et al., Presented at Conference of Electrochemical Society, Oct. 18–23, 1987, Honolulu, Hawaii.
Chromium Mask Damage in Excimer Laser Projection Processing, J. T. C. Yeh, 1988 Symposium on Laser Microlithography, SPIE, vol. 922 at p. 461.
D. L. Klein, P. A. Leary-Renick and R. Srinivasan, "Ablative Photodecomposition Process for Repair of Line Shorts," IBM Technical Disclosure Bulletin, vol. 26, No. 9, pp. 4669–4671 (Feb. 1984).
Fowler et al., "Method of Rapid Plating of Printed Circuit Boards," IBM Technical Disclosure Bulletin, vol. 27, No. 10B, pp. 6332 (Mar. 1985).
(Anonymous) "Circuit Repair Via Laser Enhanced Exchange Plating," Research Disclosure, Kenneth Mason Publications Ltd., England, No. 261 (Jan. 1986).
Acosta et al., "Laser-Enhanced Plating without Reducing Agent or External EMF Source," IBM Technical Disclosure Bulletin, vol. 24, No. 1A, p. 249 (Jun. 1981).

LASER METHODS FOR CIRCUIT REPAIR ON INTEGRATED CIRCUITS AND SUBSTRATES

This application is a continuation-in-part of the copending application Ser. No. 07/233,487 filed Jul. 25, 1988 by J. J. Donelon et al.

The present invention relates to formation of a thin conductive layer within the surface of a substrate. This layer is used in the repair of conductor discontinuities on electronic packages, integrated circuit packages, circuit boards and semiconductor ICs, and, in particular, in a method of accessing and repairing electrical opens in conducting metal lines on a semiconductor chip using laser plating techniques.

BACKGROUND OF THE INVENTION

Background Art

In the prior art (IBM Journal of Research and Development, Vol. 26, No. 2, March 1982, pp. 136–144), a laser beam impinging on an electrode is used to enhance local electroplating or etching rates by several orders of magnitude. With the aid of the laser it is possible to produce very highly localized electrodeless plating at high deposition rates to greatly enhance and localize the typical metal exchange (immersion) plating reactions and to obtain a thermo-battery driven reaction with simple aqueous solutions. Since laser beams can be readily focused to micron sized dimensions and scanned over sizeable areas, laser enhancement makes it possible to plate and etch arbitrary patterns without the use of masks.

Exchange plating occurs when a less noble metal surface is immersed in an electrolyte containing a more noble metal. In general, the process is very temperature-dependent with increased exchange plating rates occurring at higher temperatures. By locally heating the surface with a laser beam, it is possible to establish a temperature difference wherein the laser illuminated (heated) area acts as a cathode establishing a thermal potential difference with the unilluminated (cooler) portion of the surface. This technique has also been demonstrated where both the metal and the element in solution are of the same nobility (IBM Technical Disclosure Bulletin, Vol. 24, No. 1A, June 1981, p. 249), the energy required for thermal plating being provided by the thermo-battery effect.

In view of the highly localized nature of laser-enhanced exchange plating and the fact that no mask is required, it would be advantageous to use such plating methods for the repair of discontinuities in conductors on integrated circuits. More particularly, it would be advantageous to utilize laser-enhanced exchange plating in the repair of integrated circuits which have been covered by a passivation layer.

Laser enhanced exchange plating has been suggested as a means of repairing integrated circuits. See, for example, U.S. Pat. No. 4,349,583 to Kulynych et al. assigned to the present assignee. This patent is hereby incorporated herein by reference. Kulynych describes a method for high resolution maskless immersion, exchange or like plating to a substrate covered by a conductive base where the plating rate is increased through the use of a laser. U.S. Pat. No. 4,239,789 to Blum et al. assigned to the assignee of the present invention, also describes electrodeless plating onto a pre-metallized substrate.

As an alternative to the continuous metallic base plate of Kulynych et al., a non-continuous base layer may be provided (as in German Pat. Publication DE 31 39 168 A1), by depositing a $PdCl_2$ solution on the surface of the substrate to "activate" the substrate. The desired region may then be plated by the maskless exchange plating method described previously.

An alternative method of circuit repair via laser-enhanced exchange plating is described in Research Disclosure No. 26123 (No. 261 published January 1986, by Kenneth Mason Publications Ltd., England). This abstract describes a means of preventing the undesirable peripheral etching which normally accompanies laser-enhanced exchange plating. Etching is prevented by covering all exposed portions of the circuit being repaired with a "shim stock" which is in electrical contact with the circuit line and provides the ions necessary for exchange plating. The exchange plating therefore etches the shim rather than the circuit line. This means of protecting the circuit line has the disadvantage of requiring the use of a shim which substantially covers the exposed portion of the line to be plated to.

Plating techniques have also been described wherein a metallic conductor was plated directly to a non-metallic substrate by immersing the substrate in a plating solution and heating the substrate in the region where deposition is desired. This heating could be accomplished in any number of ways, including exposure to a high intensity light through a mask or the use of a laser to selectively irradiate the surface of the substrate, causing the metallic plating material to deposit out in the irradiated region.

U.S. Pat. No. 4,578,157 to Halliwell et al. describes a technique for using a pulsed laser to plate directly to a nonmetallic GaAs surface. In this patent, no conducting layer is used as a base for plating. U.S. Pat. No. 4,578,155 to Halliwell et al. extends this concept to the plating of a polymeric substrate.

U.S. Pat. No. 4,359,485 to Donnelly et al. describes an alternative method for plating a metal layer onto the surface of a group III–V compound semiconductor by placing the surface in contact with a metal containing solution and directing laser radiation through the solution. This maskless deposition technique is used to form elongated metal conductors on the substrate.

While all of these prior art techniques address the problem of maskless plating of conductors onto semiconductor surfaces, none of the references discussed to this point address the creation of a conductive layer within the surface of the substrate as a base for depositing plating and subsequently removing that conductive layer in the regions where selective plating was not deposited. Nor do they describe or suggest a maskless means of accessing and repairing discontinuities in conductors disposed on a substrate and covered by a passivation layer.

Other publications have disclosed the deposition of a conductor on a non-metallic structure which has been prepared by exposure to laser irradiation in the region where plating is desired. Japanese Patent Publication 61-104083 describes a method of preparing a substrate to be plated by first exposing the region to be plated to a laser which prepares the plating surface. This preparation is followed by electrodeless plating of the substrate to the region irradiated by the laser. Japanese Patent Publication 61-96097 describes a method of plating wherein the substrate is exposed to electrolyte flashing and laser beam radiation simultaneously, the laser beam being passed coaxially through a nozzle which also feeds electrolyte to the substrate surface.

U.S. Pat. No. 4,691,091 to Lyons et al. extends this concept to producing electrically conductive paths in a polymeric substrate by laser writing, (i.e., by tracing the desired paths on the substrate using a laser beam). The resulting paths comprise electrically conductive carbon produced by thermal decomposition of the substrate surface material. Lyons et al. point out that these conductive patterns may be plated with a metallic conductor. U.S. Pat. No. 4,663,826 to Baeuerle describes an alternative method for generating an area of increased conductivity on the surface of a body of a dielectric material wherein that material is exposed to laser radiation for a selected period of time within a reducing atmosphere. This results in a "tempering or sintering" of the material, causing an oxygen depletion within the material and resulting in an n-type semiconductor conductivity region which provides a conductive region to which metal may be plated by electroplating or other conventional plating techniques. Thus in these references the area to be plated is defined by the laser damaged regions.

In certain instances, it is necessary to remove a portion of a passivation or other layer covering a substrate in order to either access or deposit a conductor on that substrate. An example of the latter situation is the removal of photoresist in a specified region prior to deposition of a conductive run. An example of the former situation is where a substrate has been passivated—that is, covered with a passivating material to protect the substrate and the conductors thereon—before it is discovered that there are discontinuities in the conductors disposed on the substrate, it may become necessary to remove a portion of the passivation to repair discontinuities in the conductor. These two situations present entirely different problems. In the first situation, a mask determines the regions of the photoresist to be removed and this mask may be used repetitively for any number of substrates. In the second situation, the discontinuities will appear in unpredictable locations and each discontinuity will have to be individually accessed in order to repair the damaged or missing conductor. Thus, it is impossible to design or to manufacture a mask specifically designed to repair all discontinuities, especially where the discontinuities are being repaired in newly manufactured semiconductor chips. The ability to easily access and repair discontinuities in large scale integrated circuits is extremely important since it facilitates salvaging of integrated circuits which were previously discarded as being unusable.

U.S. Pat. No. 4,574,095 to Baum et al. and assigned to the assignee of the present invention describes a method of selectively depositing copper by first selectively depositing palladium seeds and subsequently irradiating a palladium compound with light through a mask. A substrate is first covered with photoresist or polymer. The coated substrate is selectively irradiated, for example, through a mask, with a pulsed excimer laser, and the polymer in the irradiated area is removed. When the substrate is exposed to the vapors of the palladium containing complex, deposition of a metal film occurs at the exposed portion. The metal film acts as a seed for plating of copper. In this way, the circuitry is imbedded in a polymeric film, the surfaces of which are level. The circuitry is thus protected from mechanical damage. The ablative etching and the deposition of the metal seed can take place either simultaneously or as separate steps. While this reference refers to the ablation of a polymer coating prior to deposition of a metal seed layer and plating of a conductor, it is accomplished by using a predefined mask to define the regions to be ablated.

None of the cited references describes a means for locally accessing and repairing damaged conductors which have been subsequently covered by an insulating or passivation layer. Since most defects in semiconductor ICs are not discovered until after the IC is manufactured, the repair of semiconductor IC runs which are not accessible from the surface is a critical need. It would be extremely useful and cost effective to find a way of quickly and accurately repairing small breaks in IC conductor lines. In addition, it would be advantageous to accomplish such repairs without the necessity of a mask step. It would also be advantageous to accomplish such repairs by thermo-plating the region between the broken lines. It would further be advantageous to accomplish repair of such IC conductor lines without the necessity of depositing a conductive layer on the surface of the semiconductor substrate prior to thermo-deposition of the repair bridge.

SUMMARY OF THE INVENTION

In accordance with this invention, a method of repairing discontinuities in conductors disposed upon a substrate is described. First, any insulative passivation covering the discontinuity is removed by ablation of that covering using a laser which selectively irradiates a region of the passivation over the discontinuity. The laser used may be a pulsed excimer laser operating at a predetermined power level which ablates away the passivation at a controlled rate. The laser continues to ablate the passivation until reaching the level of the substrate upon which the conductors are disposed. The laser then ablates away the passivation covering the conductors adjacent to the discontinuity. The laser power may then be adjusted to a second predetermined level, which power level is sufficient to prepare the exposed portions of the conductors for plating. This preparation is accomplished by irradiating the exposed portion of the conductors for a predetermined number of pulses. Once the passivation in the region of the discontinuity has been ablated away, and the exposed portions of the conductors have been prepared for plating, plating may be accomplished in any one of a number of ways.

Where the gap overlies a polyimide substrate, a method of plating that gap is to form an electrically conductive carbonaceous film in a surface region of the polyimide in the region of the gap. This reversible, i.e. removable, electrically conductive base layer suitable for plating may be formed by treating the polyimide surface with an ion beam source which may preferably be an argon (Ar+) ion beam. The base layer is formed by exposing the polyimide substrate to the ion beam source for a predetermined period of time, allowing the polyimide to cool for a second predetermined period of time and repeating the treatment of the surface of the polyimide until a carbonaceous layer of a desired resistivity is formed in that surface. This carbonaceous layer then provides a base for selective plating, preferably electrodeless laser-enhanced exchange plating, of the discontinuity. The regions not plated may be converted back to a polyimide by exposing those regions to a second ion beam which may preferably be an argon/oxygen (Ar+/O+) beam.

It is an object of the present invention to provide a method of forming a reversible carbonaceous, conductive layer in a surface of a substrate which may provide a base for the deposition of metallic conductor material.

It is a further object of the present invention to provide a maskless method of repairing discontinuities in conductors disposed on substrates.

It is a further object of the present invention to provide a maskless method of repairing discontinuities in conductors disposed on a substrate by forming a reversible, i.e., removable, carbonaceous, conductive layer on the surface of the substrate in the region of the discontinuity, locally depositing metallic conductor material on the carbonaceous layer in the region of the discontinuity to form a bridge between the conductors and removing the carbonaceous layer from the region of the substrate not covered by the bridge.

It is a further object of the present invention to provide a maskless method of repairing discontinuities in conductors disposed on the surface of a substrate which has been covered by a passivating or insulating material by ablating away the passivating or insulating material in the region of the discontinuity prior to disposing a metal bridge across the discontinuity to electrically connect the conductors.

BRIEF DESCRIPTION OF THE DRAWINGS

The novel features of the invention are set forth with particularity in the appended claims. The invention itself, however, both as to structure and function, together with further objects and advantages thereof, may best be understood by reference to the following description taken in conjunction with the accompanying drawings in which:

DETAILED DESCRIPTION OF THE INVENTION

FIGS. 1 through 4 illustrate a method of repairing discontinuities in conductors which are disposed on semiconductor or other substrates.

Figure 1:
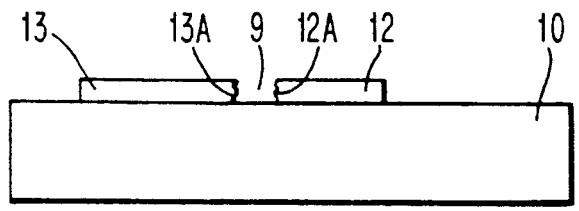
FIG. 1 illustrates a substrate including a discontinuity between conductors disposed thereon.

FIG. 1 illustrates a substrate 10 including a discontinuity 9 between conductors 12 and 13 which are disposed upon substrate 10. Substrate 10 may be an insulator such as a polyimide, a dielectric such as an oxide, or any other nonconducting surface. Conductors 12 and 13 are typically an aluminum/copper alloy, but may be gold, silver or other conducting material.

Figure 2:
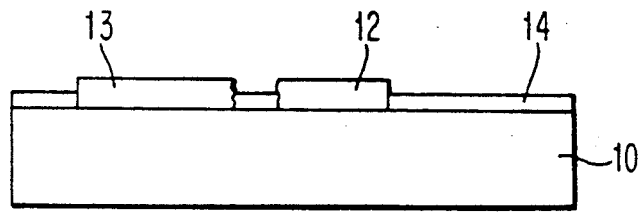
FIG. 2 illustrates the deposition of a conductive base layer over a substrate in the region of a discontinuity.

Referring to FIG. 2 a thin conductive base layer 14 is deposited over the substrate 10. Layer 14 adheres to the regions not covered by conductor 12. Base layer 14 may be any metallic layer such as chromium, copper or gold. Alternatively, base layer 14 could be a seeded layer of $PdCl_2$. Conductive base layer 14 serves as both an electrode and as a base for copper or other metal plating growth. Base layer 14 may be vacuum evaporated or sputtered onto the substrate surface to a thickness in the range of between 50 and 200 Å. The thickness should be small to facilitate easy removal of the material in the unplated areas after the plating has taken place.

Figure 3:
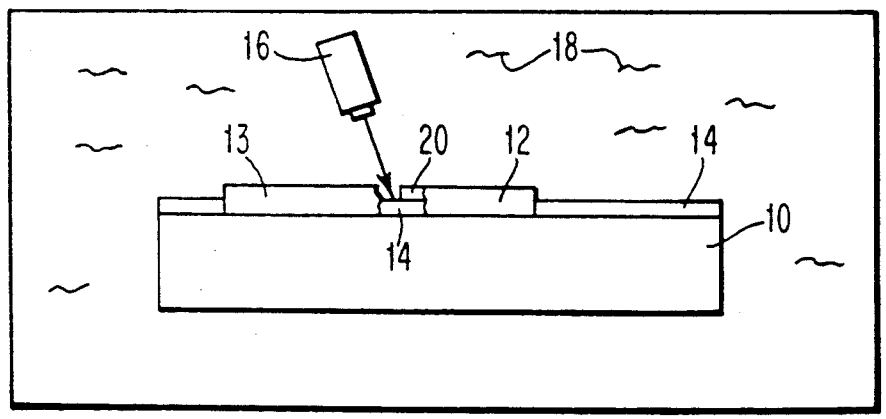
FIG. 3 illustrates a method of plating a copper bridge directly to a base layer using maskless copper deposition.

FIG. 3 illustrates the plating step, in which a copper bridge 20 is plated directly to base layer 14. This is a maskless copper deposition step which is accomplished by locally heating base layer 14 in the region of discontinuity 9 (i.e., the area between the ends of the conductors to be connected) with a well focused, high energy light source 16 while the substrate is submerged in an electrolyte such as copper sulfate solution 18.

The high energy light source 16 may be a continuous wave argon ion laser or any laser which is not heavily absorbed by the plating solution (the electrolyte). Beam 17 from high energy light source 16 is swept across the region to be plated, "writing" on base layer 14 in that region and causing the copper to plate to the base layer.

The plating method described is known in the art as laser-enhanced exchange plating. This thermo-battery effect is accomplished by heating an exposed portion of a conductor, changing the free energy of the heated region relative to the unheated regions. The heated region acts as a cathode, capable of providing electrons to positive metal ions (in this case copper ions) in solution which plate onto the heated region. To maintain charge neutrality, positive charge must be replenished in the solution. The positive charge can come from positive metal ions going into solution from colder regions of the conductor, or from another source within the solution which is electrically connected to the conductor.

The concentration of copper sulfate solution 18 used in this plating method is typically one molar (1 mole per liter) of $CuSO_4$ (250 grams of $CuSO_4$/liter) with the addition of various amounts of $H_2SO_4$. A concentration of from 27–54 cc/liter of $H_2SO_4$ produces the desired results.

Figure 4:
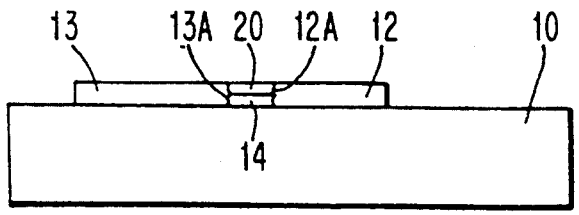
FIG. 4 illustrates a repaired substrate including a plated bridge electrically connecting two conductors.

When the repair is complete, as in FIG. 4, the repaired bridge will consist of a plated copper bridge 20 sitting atop conductive base layer 14 in discontinuity 9 and electrically contacting portions 12a and 13a of conductor 12. The remaining conductive base layer 14 may be removed by etching using an argon ion beam or other appropriate etching method so that the plating would be confined to the circuit lines.

An alternative approach to the laser-enhanced exchange plating illustrated in FIG. 3 is as follows. Once a small layer of copper was "written" onto the conductive base layer 14, the plating thickness could be increased using conventional copper plating methods. Since conductive base layer 14 would be stripped off prior to this second plating step, the plating would take place only in the region of the repair.

In both of these plating methods, the original plated layer 20 is started by writing on conductive base layer 14 at low energies, for example, 25 kw/cm$^2$, incident on the liquid/solid interface. It will be recognized that the actual range depends on the physical and thermal characteristics of the conductors, the base layer, the substrate, as well as the absorptivity of the plating medium. Therefore, depending on the parameters of the various materials, the incident energy may be in the range of 2.5-250 kw/cm$^2$. At 25 kw/cm$^2$ and a scan rate of approximately 50 um/sec, an initial thin, shallow (less than one micron high) line is written. Again, depending on the optical, thermal and physical characteristics, the scan rate may include a fixed illumination of the entire gap up to 500 um/sec.

Although the base layer 14 is not absolutely necessary to provide a bridge between conductors, it increases the smoothness of the repair since the repair is built from the substrate up rather than from one conductor to the other. Thus base layer 14 improves the planarization of the passivation surface. In addition, the use of a base layer is advantageous because it provides a means of creating a copper bridge between conductors 12 and 13 which are typically constructed of an aluminum/copper alloy wherein copper makes up a low amount (approximately 4% by weight) of the conductor material. It is normally very difficult to plate copper to such an alloy.

FIGS. 5 through 9 illustrate an alternative method of repairing discontinuities in conductors by creating a thin, electrically conducting carbonaceous film in the surface of a polyimide insulator. While this method of repairing discontinuities is similar to the method described with reference to FIGS. 1 through 4, the conductive base layer 14 has been eliminated.

Figure 5:
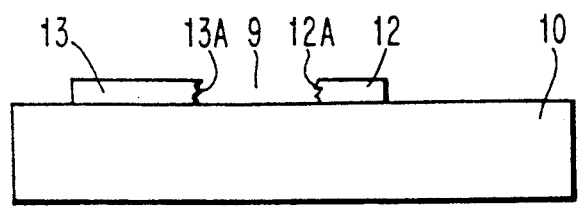
FIG. 5 illustrates a polyimide substrate including a discontinuity between conductors disposed thereon.

In FIG. 5 conductors 12 and 13 with discontinuity 9 are disposed on the surface of substrate 10. Conductors 12 and 13 are an aluminum/copper alloy containing approximately 4% by weight of copper. Substrate 10 may be polyimide or other organic insulator.

Figure 6:
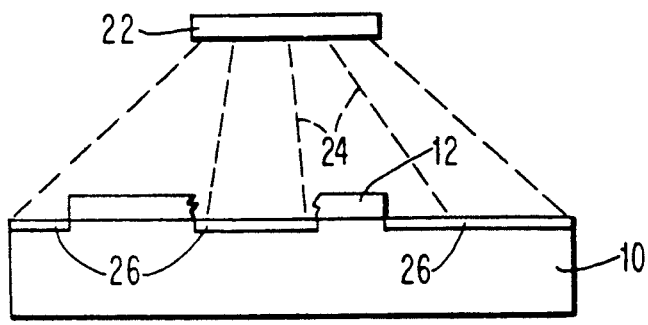
FIG. 6 illustrates a method of forming a carbonaceous film conductive layer in the surface of a polyimide substrate.

In FIG. 6 a carbonaceous film 26 is formed in the surface of insulator 10 by means of an ion beam source 22. The ion beam source 22 may be an argon (Ar$^+$) ion beam source which transforms the top (approximately 50 Å to 100 Å) of the polyimide to an electrically conductive carbonaceous film. Typically, this ion beam will illuminate a region from 1 to 50 cm. in diameter, depending on the size of the region to be carbonized. As will be seen, this electrically conducting carbonaceous film performs substantially the same function as conductive base layer 14 in FIG. 2.

Figure 7:
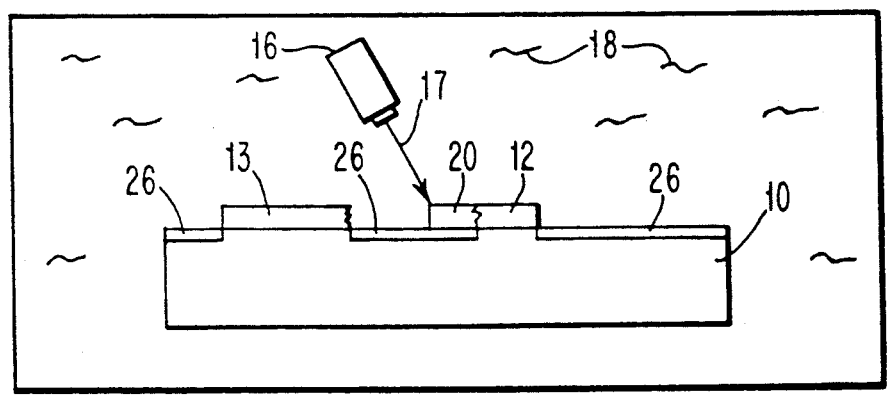
FIG. 7 illustrates a method of plating a copper bridge to a carbonaceous layer.

In FIG. 7 substrate 10 is submersed in a plating solution such as copper sulfate solution 18. Copper is then plated to the carbonaceous layer 26 by laser 16 in the same manner as plated bridge 20 was plated to conductive base layer 14 in FIG. 3. When this plating is complete, a bridge 20 will have been formed between conductors 12 and 13.

Figure 8:
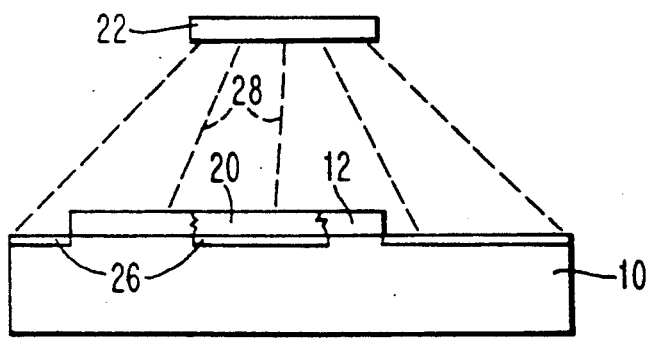
FIG. 8 illustrates a means of removing a carbonaceous layer from the surface of a polyimide substrate.
Figure 9:
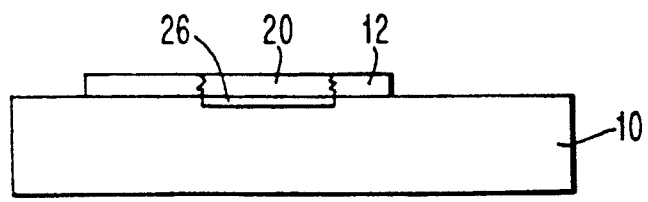
FIG. 9 illustrates a repaired substrate including a plated bridge electrically connecting two conductors and overlying a carbonaceous layer.

FIG. 8 illustrates a means of removing the carbonaceous layer 26 from the surface of insulator 10 not covered by plated bridge 20. Removal is accomplished by exposing insulator 10 to a second wide area ion beam source 22. Source 22, which is an argon/oxygen (Ar$^+$/O$^+$) or argon/nitrogen (Ar$^+$/N$^+$) mixed ion beam source, removes the carbonaceous film and regenerates the electrically insulating surface. Thus, creation of the carbonaceous film is a reversible process.

Carbonaceous layer 26 (FIG. 8) is an effective alternative to thin metal base layer 14 discussed with reference to FIG. 2. Carbonaceous layer 26 is stable in the usually acidic electroplating solutions used in the plating process and, therefore, it permits long exposure times. This is to be distinguished from the method discussed with reference to FIGS. 1 through 4, wherein electrically conducting base layer 14 is not sufficiently stable in the electroplating solution to enable long process times and multiple repairs.

Carbonaceous conductive layer 26 may be produced on polyimide by exposing the polyimide to an Ar$^+$ ion beam with an incident energy of approximately 800 electron-Volts (eV) and a current density of approximately 0.40 ma/cm$^2$. These voltage and current limitations are not critical to the process. Incident energy levels from 400 to 2,000 eV and even higher along with current densities from 0.2 to 5.0 ma/cm$^2$ have been found to produce acceptable results. The carbonaceous layer results from bombardment-induced degradation. Heating of the surface is an undesirable by-product of this process which may be controlled by exposing the polyimide to the ion beam for a fixed period (e.g., 5 minutes) followed by a cooling time sufficient to ensure that the surface is cool. This procedure is repeated from 1 to 8 times until the desired sheet resistance of about 1 to 10 ohms per square is obtained.

Heating is an undesirable by-product of this process because heating can produce irreversible changes to the polyimide layer. Specifically, excess heating turns much or all of the polyimide to carbonaceous material making it impossible to return the layer back to pure polyimide. For instance, heating the layer between 150 and 350 degrees C. for an extended time irreversibly turns the entire thickness of the polyimide layer into carbonaceous material. Alternatively, too much surface heating can create a carbonaceous layer which penetrates too deeply (more than 100 angstroms) into the surface of the polyimide layer. Removing this deep carbonaceous surface layer to return the layer to pure polyimide would waste much of the original polyimide layer.

The present invention creates a thin, removable carbonaceous layer in the surface of the polyimide layer by cooling the polyimide after an irradiation step then repeating the irradiation and cooling steps until a carbonaceous layer of proper depth is formed. Typically, the polyimide layer heats to approximately 100 degrees C. after being irradiated for a selected period of time. The polyimide then cools to room temperature (27 degrees C.) or below (typically 15 degrees C.) before the next irradiation. This cooling period is in the range of 15 seconds to 5 minutes. The cooling time range is more preferably 20 seconds to 1 minute and most preferably 20 seconds to 30 seconds. The cooling step limits the maximum temperature that the polyimide layer can achieve after each irradiation and therefore limits the amount of the polyimide surface that is converted to carbonaceous material. The maximum polyimide temperature allowed in this process is 150 degrees C. A more preferred maximum temperature is 100 degrees C.

Because the polyimide layer is irradiated in a vacuum, the layer can not be cooled to ambient temperature by convection. Instead, a substrate, such as silicon, to which the polyimide layer is attached is in turn attached to a heat sink. The heat sink preferably is a water cooled copper plate. Heat is conducted away from the polyimide layer through the substrate and then to the heat sink. Any other method used to cool the polyimide layer is within the contemplation of this invention.

The carbonaceous layer generated may be removed and the original insulating polyimide surface reformed by exposing the surface to a low energy (approximately 200 volt) $Ar^+$ beam having a significant fraction (up to 50%) of nitrogen or oxygen and a current density of less than 0.2 ma/cm$^2$. Exposure times of several minutes are sufficient to remove most of the carbonaceous layer, leaving the surface of the polyimide in an insulating state.

It should be recognized that it is not necessary to utilize a broad beam or wide area ion beam in the repair method illustrated in FIGS. 5 through 9. A narrowly focused ion beam may be used to write the carbonized layer directly under the conductor break. However, it is more difficult to focus an ion beam in this manner than to simply carbonize a broad area and use a laser as the writing instrument, especially in view of the reversibility of the carbonization.

In addition, it is not necessary to use the thermo-battery plating technique described with reference to FIGS. 1 through 9, since gas phase deposition will also achieve the desired result. Referring particularly to FIGS. 5 through 9, in the gas phase technique, insulator 10 is treated with an ion beam and the carbonaceous layer formed, just as in FIG. 6. However, insulator 10 is immersed in a gas phase atmosphere such as copper acetyl acetonate. Deposition is accomplished using a pyrolitic or photo decomposition technique wherein the region to be metallized is written over by a laser while in contact with the gas. The copper is released from the chemical bond and sticks to the surface in the region being subjected to the intense heat caused by the focused laser during pyrolytic decomposition. In some cases, photo decomposition of the gas phase can also result in metal deposition at temperatures considerably lower than those required for the pyrolytic process.

Figure 10:
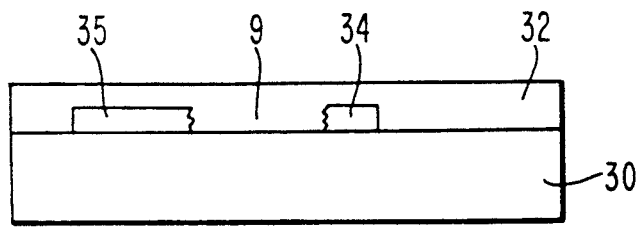
FIG. 10 illustrates a substrate including a discontinuity between conductors disposed thereon and covered by an insulating or passivating layer.

FIGS. 10 through 13 illustrate another method of repairing discontinuities in conductors after a device has been covered by an insulating or passivating layer to protect the substrate and the conductors. FIG. 10 illustrates such a circuit.

In FIG. 10, the substrate 30 may be an oxide or nitride dielectric or an insulator such as a polyimide. The nature of the substrate is not important to the effectiveness of this method.

Figure 11:
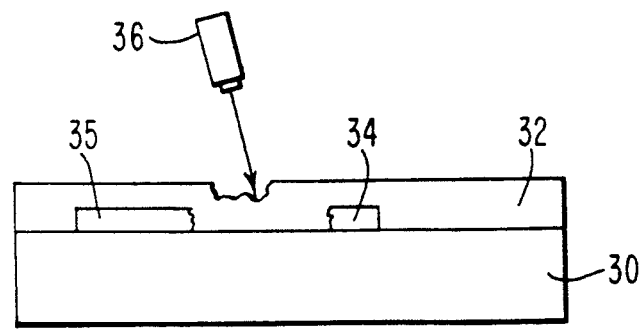
FIG. 11 illustrates a method of ablating a passivating or insulating layer to uncover a region of a substrate and provide access to discontinuities in that region.

In FIG. 11 passivation 32 is ablated by laser 36, thus removing the passivation layer and providing access to the discontinuity. Ablation is accomplished by exposing the surface of polymer 32 to some number of pulses (the absolute number depends on the thickness and composition of the polymer passivation layer) of pulsed excimer laser 36 at a fluence in the range of 50 mj/cm$^2$ to 3 j/cm$^2$ or higher. At a fluence of 500 mj/cm$^2$, ablation of the polymer passivation layer has been achieved without damaging any underlying layers or conductors 34 and 35. Ablation of a polymer passivation layer may be accomplished using an ultraviolet laser whose wavelength is selected to be absorbed by the polyimide insulator. The laser excites the molecules of the polyimide, causing it to fly apart without generating substantial amounts of heat. Thus, the polyimide is removed without destroying or damaging surrounding materials.

In order to control the ablating process and avoid damaging or removing material below a desired depth, a pulsed laser is used. The number of pulses should be carefully selected to ablate the polyimide layer to the desired depth without damaging any underlying material.

The method of repair illustrated in FIGS. 10 through 13 has the additional advantage of providing a means of preparing the ends of conductors 34 and 35 for plating by exposing them to several pulses of the excimer laser at a fluence in the range of 200 mj/cm$^2$ to 5 j/cm$^2$. By exposing the conductor (which is normally an aluminum/copper alloy) to pulses from the excimer laser at a fluence of approximately 1.2 j/cm$^2$, the oxide coating on the conductor has been found to be sufficiently damaged or removed to enhance the plating between copper bridge 40 and the aluminum and to substantially eliminate the high ohmic contact resistance normally encountered when such plating is attempted.

Figure 12:
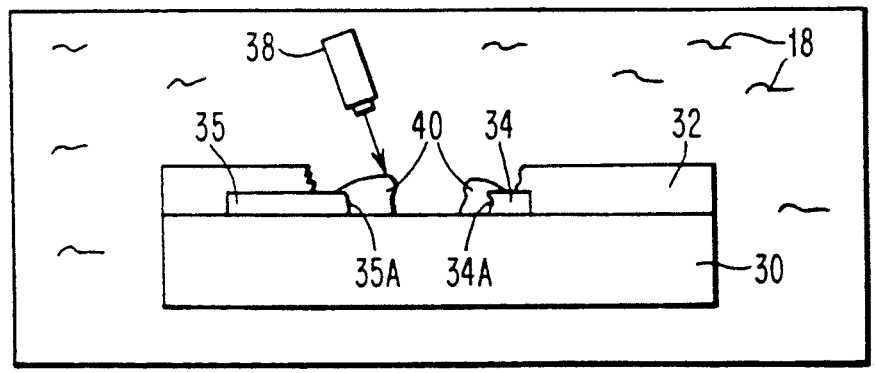
FIG. 12 illustrates a method of plating a copper bridge between two exposed conductors.

FIG. 12 illustrates the actual plating of copper bridge 40. This plating may be accomplished by the methods previously described with reference to FIGS. 1 through 9. Plating may also be accomplished without using either the metal base of FIGS. 1 through 4 or the carbonaceous layer of FIGS. 5 through 9. In FIG. 12 bridge 40 is plated by placing substrate 30 into a copper sulfate bath, typically 0.1 to 1 molar with a similar concentration of sulfuric acid to produce the appropriate pH. Exposing substrate 30 to a focused laser such as an argon laser 18, with a power density on the order of 100 W/cm$^2$ to 10 KW/cm$^2$ in the region of discontinuity 9 causes the copper to plate directly to the conductor. Power densities on the order of 100 W/cm$^2$ have been found to be effective when laser generated. However, such power densities are not limited to lasers and may be generated by other light sources. To bridge the circuit gap, the laser is repeatedly scanned between the two exposed line-ends 34a and 35a. The copper plates to the line-ends 34a and 35a until a bridge 40 is formed in the center of the defect 9. Simultaneous etching occurs which maintains charge neutrality at any cold or non-irradiated metal region which is in electrical contact with the area being bridged.

Figure 13:
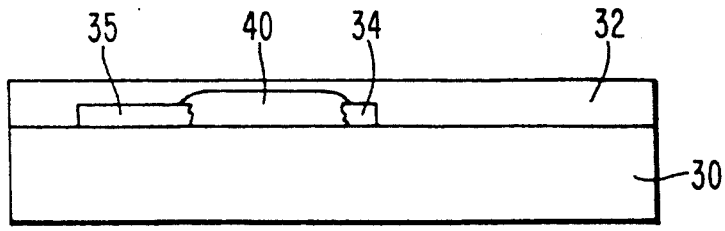
FIG. 13 illustrates a completed device including a plated bridge after the passivation layer has been replaced.

FIG. 13 illustrates the completed device after passivation layer 32 has been repaired. Such a repair may be achieved, for example, by depositing new polyimide into the ablated hole or by other suitable methods.

While a preferred embodiment of the present invention includes the formation of a carbonaceous layer in a polyimide substrate, persons of skill in the art will recognize that the method of the present invention is not limited to the formation of carbonaceous layers in polyimide substrates. Suitable base layers may be formed in any substrates which form carbonaceous layers when irradiated using the ion bombardment techniques described herein. Such substrates might include, for example, any polymeric substance, some types of photo resist material, and even certain epoxy resin compounds.

What has been described herein is a maskless means of repairing discontinuities in a conductor disposed on the surface of a substrate wherein the surface is locally irradiated to form a reversible carbonaceous layer thereon. This reversible carbonaceous layer acts as a base for electrodeless deposition of a metal to form a bridge across the discontinuity by laser-enhanced exchange plating or another suitable method. Further, a means of accessing and repairing a discontinuity buried by a cover layer of an insulating or passivating material is described, wherein access to the discontinuity is provided by ablating away the cover layer using a pulsed excimer laser at a first power level. Once enough of the cover layer has been removed to expose both the discontinuity and a portion of the conductors to be bridged, a pulsed excimer laser at a second power level is used to enhance the surface characteristics of the conductors for plating. Finally, the discontinuity is bridged using any one of a number of metal deposition techniques, including the use of a carbonaceous layer.

While preferred embodiments of the present invention have been shown and described herein, it will be obvious to those skilled in the art that such embodiments are provided by way of example only. Numerous variations, changes, and substitutions will now occur to those skilled in the art without departing from the invention. Accordingly, it is intended that the invention be limited only by the spirit and scope of the appended claims.

We claim:

1. A method of forming an electrically conductive film layer in the surface of a substrate, comprising the steps of:
   (a) irradiating the substrate surface with an ion beam for a first period of time sufficient to form a carbonaceous surface region thereon;
   (b) allowing said substrate to cool for a second period of time between 15 seconds and 5 minutes; and
   (c) repeating steps (a) and (b) until the sheet resistance of said carbonaceous surface region reaches a predetermined value.

2. The method of claim 1 wherein said substrate is comprised of a polymeric material.

3. The method of claim 2 wherein said polymeric material is polyimide.

4. The method of claim 1 wherein said ion beam is a large area ion beam.

5. The method of claim 4 wherein said ion beam is an $Ar^+$ ion beam.

6. The method of claim 5 wherein said ion beam has an incident energy in the range of 400–2,000 electron-Volts and a current density in the range of 0.2–5.0 milliamperes per square centimeter.

7. The method of claim 1 wherein said first period of time is approximately five minutes.

8. The method of claim 1 wherein said predetermined sheet resistance value is approximately 1–10 ohms per square.

9. A method, as in claim 1, with a cooling period of time between 20 seconds and 1 minute.

10. A method, as in claim 1, with a cooling period of time between 20 seconds and 30 seconds.

11. A method, as in claim 1, with a cooling period of time long enough to allow the irradiated surface region to cool to room temperature.

12. A method, as in claim 1, with a cooling period of time long enough to maintain the temperature of the film layer and substrate below 150 degrees C. throughout the entire process.

13. A method, as in claim 1, with a cooling period of time long enough to maintain the temperature of the film layer and substrate below 100 degrees C. throughout the entire process.

* * * * *